US007501570B2

(12) United States Patent
Shibata

(10) Patent No.: US 7,501,570 B2
(45) Date of Patent: Mar. 10, 2009

(54) ELECTRIC WIND INSTRUMENT AND KEY DETECTION STRUCTURE THEREOF

(75) Inventor: Koichiro Shibata, Aisai (JP)

(73) Assignee: Yamaha Corporation (JP)

( * ) Notice: Subject to any disclaimer, the term of this patent is extended or adjusted under 35 U.S.C. 154(b) by 58 days.

(21) Appl. No.: 11/472,161

(22) Filed: Jun. 21, 2006

(65) Prior Publication Data

US 2006/0283312 A1 Dec. 21, 2006

(30) Foreign Application Priority Data

Jun. 21, 2005 (JP) ............................ 2005-180332

(51) Int. Cl.
*G10H 1/34* (2006.01)
*H03K 17/969* (2006.01)
*H03K 17/94* (2006.01)

(52) U.S. Cl. ...................... 84/723; 84/724; 84/DIG. 7; 341/21; 341/31; 984/345

(58) Field of Classification Search .................. 84/723, 84/724, DIG. 7; 341/20, 31; 984/345
See application file for complete search history.

(56) References Cited

U.S. PATENT DOCUMENTS 3,938,419 A * 2/1976 De Rosa ...................... 84/678
4,028,977 A * 6/1977 Ryeczek ...................... 84/724
4,342,244 A * 8/1982 Perkins ........................ 84/672
4,429,607 A * 2/1984 Meno .......................... 84/679
4,527,456 A * 7/1985 Perkins et al. ................ 84/654
4,815,353 A * 3/1989 Christian ..................... 84/724
4,915,008 A * 4/1990 Sakashita ..................... 84/658
4,919,032 A * 4/1990 Sakashita ..................... 84/653
4,993,307 A * 2/1991 Sakashita ..................... 84/615
5,036,745 A * 8/1991 Althof, Jr. .................... 84/656
5,107,748 A 4/1992 Muramatsu et al.
5,125,315 A * 6/1992 Kawashima ................. 84/619
5,354,947 A * 10/1994 Kunimoto et al. ............. 84/622

(Continued)

FOREIGN PATENT DOCUMENTS

JP 2-214897 A 8/1990

(Continued)

OTHER PUBLICATIONS

Notice of Reason for Refusal issued in corresponding JP application No. 2005-180332, dated Jul. 29, 2008.

*Primary Examiner*—Walter Benson
*Assistant Examiner*—Andrew R Millikin
(74) *Attorney, Agent, or Firm*—Rossi, Kimms & McDowell, LLP

(57) ABSTRACT

Wind instrument includes a tubular body having a plurality of tone holes, and a plurality of keys capable of opening and closing the tone holes. Via a retaining member, detector units are provided within the tubular body in corresponding relation to the keys, and each of the detector units is generally opposed to the back surface of the corresponding key. Each of the detector units detects a relative distance to the back surface and outputs an electrical signal, on the basis of which an opening/closing state of the key can be detected. The retaining member, accommodated in the tubular body, positions and retains each of the detector units in such a manner that the keys and tubular body and the individual detector units are kept in non-contacting relation to each other.

10 Claims, 6 Drawing Sheets

U.S. PATENT DOCUMENTS 5,403,966 A * 4/1995 Kawashima et al. .......... 84/613
5,408,042 A * 4/1995 Masuda ....................... 84/661
5,668,340 A * 9/1997 Hashizume et al. ........... 84/742
5,736,662 A * 4/1998 Spector ....................... 84/600
5,808,218 A * 9/1998 Grace .......................... 84/456
5,922,985 A * 7/1999 Taniwaki ..................... 84/742
5,929,361 A * 7/1999 Tanaka ........................ 84/742
6,538,189 B1 * 3/2003 Ethington .................... 84/615
6,881,890 B2 * 4/2005 Sakurada ..................... 84/654
7,049,503 B2 * 5/2006 Onozawa et al. .............. 84/723
2003/0202753 A1 * 10/2003 Kato et al. .................... 385/88
2004/0069131 A1 * 4/2004 Ludwig ....................... 84/723
2005/0077453 A1 * 4/2005 Kato .......................... 250/221
2005/0217464 A1 * 10/2005 Onozawa et al. .............. 84/723
2007/0068372 A1 * 3/2007 Masuda et al. ................ 84/723
2007/0137468 A1 * 6/2007 Shibata ........................ 84/723
2007/0227343 A1 * 10/2007 Sawada et al. ................ 84/723
2007/0234887 A1 * 10/2007 Sawada et al. ................ 84/723

FOREIGN PATENT DOCUMENTS

JP 3-108300 U 11/1991
JP 4-89999 U 8/1992
JP 8-305362 A 11/1996

* cited by examiner

ELECTRIC WIND INSTRUMENT AND KEY DETECTION STRUCTURE THEREOF

BACKGROUND OF THE INVENTION

The present invention relates generally to key detection structures for wind instruments, and more particularly to an improved key detection structure for a wind instrument which allows detector units, for detecting states etc. of corresponding keys, to be readily attached and detached to and from the wind instrument.

There have been known key detection structures of a type which reproduces electronic tones by detecting operation of keys on a wind instrument, and examples of such a type of key detection structure are disclosed in Japanese Utility Model Application Laid-open Publication No. HEI-4-89999 and Japanese Patent Application Laid-open Publication No. HEI-8-305362. According to the disclosure of the No. HEI-4-89999 and No. HEI-8-305362 publications, a module including switches and hall elements is previously incorporated in a tubular body and keys forming the wind instrument. Namely, the wind musical instruments disclosed in these publications differ in construction and tone-generating form from the so-called acoustic type wind musical instruments; namely, if the module is removed, the disclosed wind musical instruments can no longer generate any performance tone. I recent years, however, there has been a demand that the above-mentioned module be detachably attached to an acoustic musical instrument so that two different kinds of tones, i.e. electronic reproduced tone and acoustic performance tone generated by the musical instrument itself, can be used appropriately as needed.

Where an acoustic-type wind musical instrument is to be constructed to detect operation of keys in order to reproduce electronic tones as well, use of structure (1) and structure (2) outlined below are conceivable.

According to structure (1), a magnetic member is fixed to a position adjacent to the reverse or back surface of a key, and a hall element is mounted in the tubular body. As the key opens or closes a tone hole, variation in magnetic field responsive to the displacement of the magnetic member is detected by the corresponding hall element, so that an electrical signal corresponding to the key's opening or closing movement is output.

Structure (2) is different from structure (1) in terms of attached positions of the magnetic member and hall element. Namely, according to structure (2), the magnetic member is supported outside the corresponding key via an arm, while the hall element is attached to the outer surface of the tubular body.

However, structure (1) above would present the inconvenience that operation for attaching the magnetic member to the position adjacent to the back surface of the key requires is very cumbersome and requires a great amount of time. The inconvenience is due to the fact that, during the attaching operation, it is essential to attach the magnetic member after detaching or disassembling the key from the tubular body and insert the magnetic member into a narrow space between the tubular body and the key. Further, because the magnetic member is attached to the position adjacent to the back surface of the key, the structure would be subjected to the constraint that the tone hole can not be opened and closed by the key unless the magnetic member is sized so to be received in the tone hole.

Further, structure (2) above would present the inconveniences that operation for attaching the hall element to the outer peripheral surface of the tubular body and a construction for supporting the magnetic member via the arm tend to be very complicated, and that operation for disassembling the key and the like at the time of repair or care of the wind instrument tends to be cumbersome and difficult. In particular, because the outer peripheral surface of the tubular body is a curved surface, the attached state of the hall element tends to be unstable.

SUMMARY OF THE INVENTION

In view of the foregoing, it is an object of the present invention to provide a key detection structure for a wind instrument which is simple in construction and allows each detector unit to be attached and detached with ease.

It is another object of the present invention to provide a key detection structure for a wind instrument which can be attached to an acoustic-type musical instrument.

In order to accomplish the above-mentioned objects, the present invention provides an improved key detection structure for detecting opening/closing states or positions of keys in a wind instrument including a tubular body having a plurality of tone holes formed therein and a plurality of the keys pivotably mounted on the tubular body to open/close the tone holes, which comprises: a plurality of detector units provided within the tubular body in corresponding relation to the plurality of the keys, each of the detector units being generally opposed to the back surface of the corresponding key to detect a relative distance to the back surface and output an electrical signal corresponding to the relative distance; and a retaining member accommodated in the tubular body and positioning and retaining each of the detector units in such a manner that that the keys and tubular body and the individual detector units are kept in non-contacting relation to each other.

According to the present invention, the individual detector units can be attached and detached with ease and promptly by just inserting and taking the retaining member into and out of the tubular body. With the detector units kept in non-contacting relation to the corresponding keys, the present invention can eliminate the needs for attaching the detector units with respect to the individual keys and placing the detector units in the tone holes, with the result that not only the key detection structure can be simplified in construction but also constraints or limitations in design, such as a size, of the detector units can be significantly lessened. In addition, the present invention can save labor in diassembling the keys from the tubular body and also reduce workload necessary for care and repair of the wind instrument.

Preferably, the retaining member includes an axially-extending member extending along the axis of the tubular body, and a plurality of contact portions provided on the axially-extending member and pressed against the inner peripheral surface of the tubular body. With the contact portions pressed against the inner peripheral surface of the tubular body, the retaining member can be supported by the inner peripheral surface of the tubular body in such a manner that it is freely attachable and detachable to and from the tubular body, even where the inner surface of the tubular body is a smooth surface as in a so-called acoustic-type wind instrument. Further, the retaining member can be moved, by application of an external force, to allow the contact portions to be displaced little by little within the tubular body, so that fine adjustment of the installed position of the detector units can be made with ease. Furthermore, with the detector units provided on the single axially-extending member at positions corresponding to the keys, the present invention can even further expedite the installation operation.

Preferably, the axially-extending member has at least two retaining surfaces oriented in different directions, and these retaining surfaces are constructed to retain thereon the detector units. Thus, even where the wind instrument has keys oriented in two different directions, e.g. in an upward direction and obliquely-downward direction as viewed from a human player of the instrument, the detector units corresponding to the differently oriented keys can be readily fixed in predetermined positions via the single axially-extending member.

Preferably, each of the detector units comprises a photo reflector. Thus, in the present invention, a distance between the photo reflector and the key can be detected accurately, so that the opening/closing state of the key can be detected with a high accuracy.

Preferably, a reflector member or refractor member is provided between each of the detector units and the key corresponding to the detector unit so that light emitted by the photo reflector can be reflected or refracted by the reflector member or refractor member. Thus, where the light emitted by the photo reflector is reflected or refracted via the reflector or refractor member, the light emitted by the photo reflector can be appropriately directed to fall on the back surface of the key irrespective of the orientation of the photo reflector, with the result that the present invention can reduce the positional constraints of the detector units and thereby enhance the design freedom.

The following will describe embodiments of the present invention, but it should be appreciated that the present invention is not limited to the described embodiments and various modifications of the invention are possible without departing from the basic principles. The scope of the present invention is therefore to be determined solely by the appended claims.

BRIEF DESCRIPTION OF THE DRAWINGS

For better understanding of the objects and other features of the present invention, its preferred embodiments will be described hereinbelow in greater detail with reference to the accompanying drawings, in which.

DETAILED DESCRIPTION OF THE INVENTION

Figure 1:
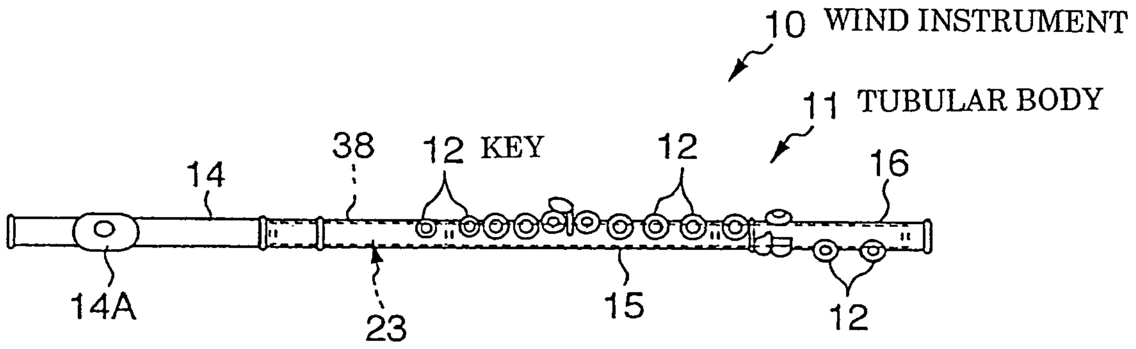
FIG. 1 is a schematic plan view of a wind instrument to which is applied a key detection structure in accordance with an embodiment of the present invention.
Figure 2:
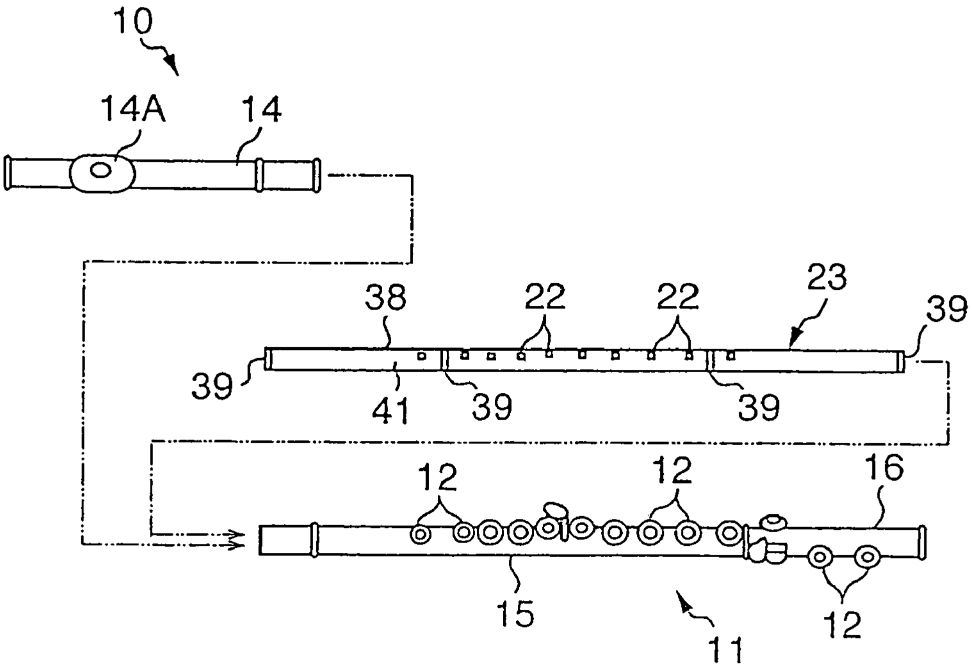
FIG. 2 is an exploded view of the wind instrument shown in FIG. 1.

FIG. 1 is a schematic plan view of a wind instrument to which is applied a key detection structure in accordance with an embodiment of the present invention, and FIG. 2 is an exploded view of the wind instrument shown in FIG. 1. This wind instrument 10 is in the form of an acoustic-type flute of the conventionally-known construction, which can perform predetermined tone pitches by vibrating air using any of the conventional performance styles. The wind instrument 10 comprises a tubular body 11 extending in a left-right direction of FIG. 1, and a plurality of keys 12 provided on the tubular body 11.

The tubular body 11 comprises a head joint (or head section) 14 having an embouchure plate 14A, a main tube (or main body) 15 connectable to one end (right end in FIG. 2) of the head joint 14, and a foot joint (or tail section) 16. As seen from a schematic vertical sectional view of FIG. 3, the main tube 15 and foot joint 16 have a plurality of tone holes 18 formed therethrough (and hence communicating the interior and exterior of the main tube 15 and foot joint 16), and these tone holes 18 each have an opening portion 18A that opens in an upward direction or rightward and downward (i.e., obliquely-downward) direction of FIG. 3.

Figure 4:
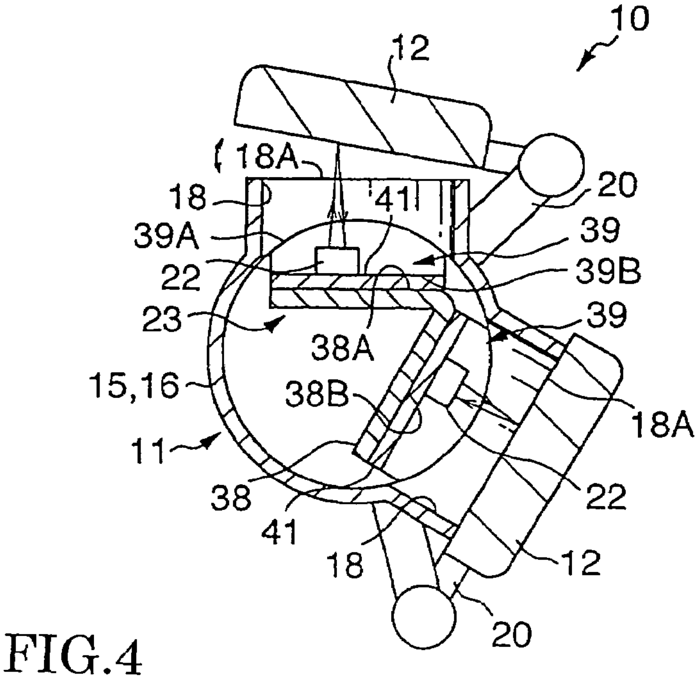
FIG. 4 is a sectional view, similar to FIG. 3, which particularly shows a tone hole in an opened state.

Each of the keys 12 is formed into a dish shape and disposed adjacent to the opening portion 18A of one of the tone holes 18. Each of the keys 12 is pivotably supported via an arm 20 on the main tube 15 or foot joint 16 to open and close the tone hole 18 (see FIG. 4). Detector units 22 are provided in corresponding relation to the keys, and each of the detector units 22 is positioned and retained, via a retaining member 23, in the interior of the tubular body 11 and generally opposed to the reverse or back surface of the corresponding key 12.

Each of the detector units 22, which are disposed in positionally-corresponding relation to the keys 12, is capable of detecting a relative distance to the back surface of the corresponding key 12 to output an electrical signal corresponding to the distance. With such a detector unit 22, an opened/closed state of the tone hole 18, openable and closable by the key 12, can be detected.

Figure 5:
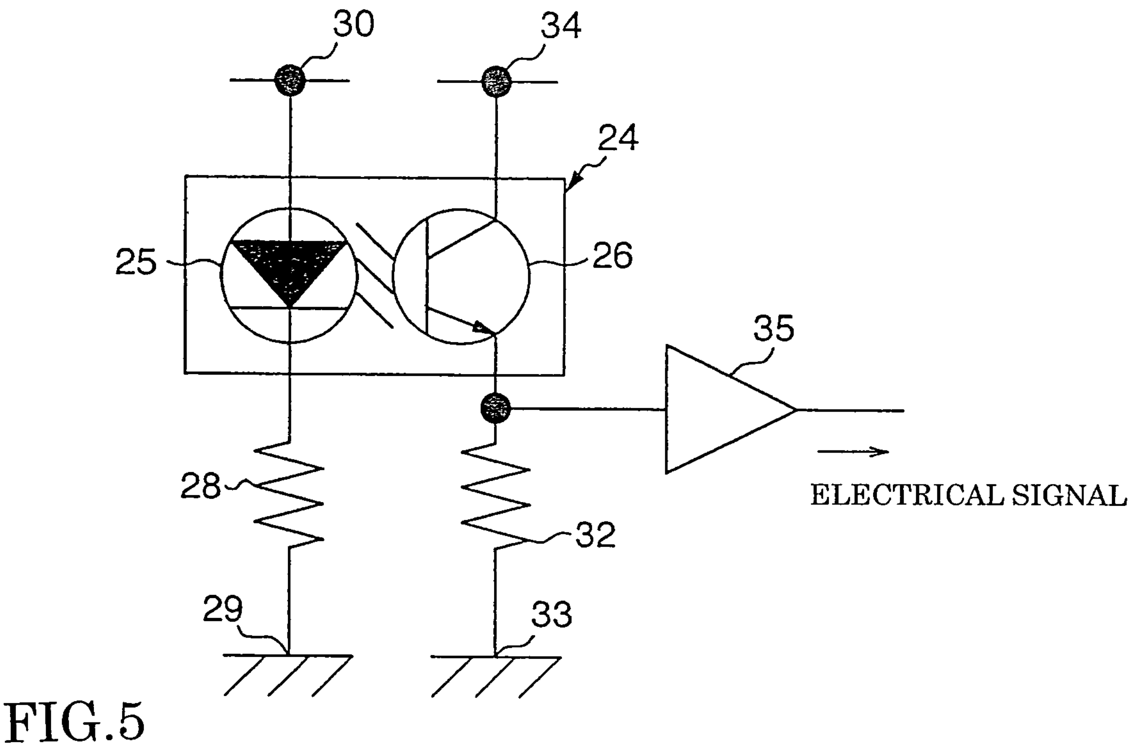
FIG. 5 is a block diagram of a detector unit employed in the key detection structure.

More specifically, as shown in FIG. 5, each of the detector units 22 comprises an infrared photo reflector 24, and this infrared photo reflector 24 comprises a light emitting diode 25 and a photo transistor 26. The light emitting diode 25 is connected at one end via a resistor 28 to the ground (i.e., earth) 29 and connected at the other end to a power supply 30. Once electric power is supplied by the power supply 30, the light emitting diode 25 emits an infrared ray toward the back surface of the key 12. The photo transistor 26 is connected at one end via a resistor 32 to the ground (i.e., earth) 33 and connected at the other end to a power supply 34 so that electric power is supplied to the photo transistor 26 by the power supply 34. The photo transistor 26 receives the infrared ray reflected off the back surface of the key 12 and thereby supplies a buffer 35 with a voltage corresponding to the relative distance to the back surface of the key 12. The buffer 35 outputs to a later-described predetermined control section an electrical signal varying in response to the supplied voltage.

Figure 3:
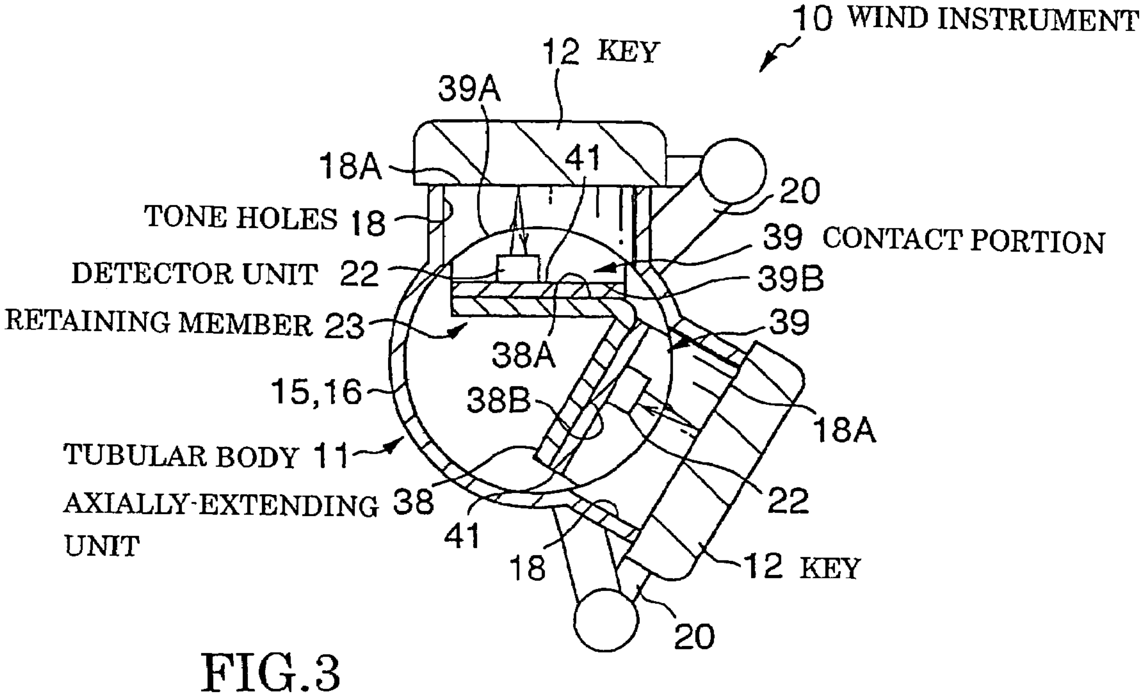
FIG. 3 is a schematic cross sectional view of the wind instrument.
Figure 6:
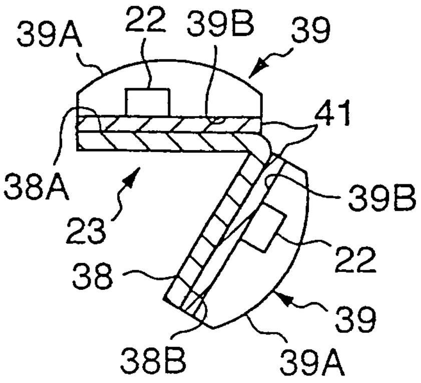
FIG. 6 is a sectional view, similar to FIG. 3, which particularly shows a contact portion provided on an axially-extending member employed in the key detection structure.
Figure 7:
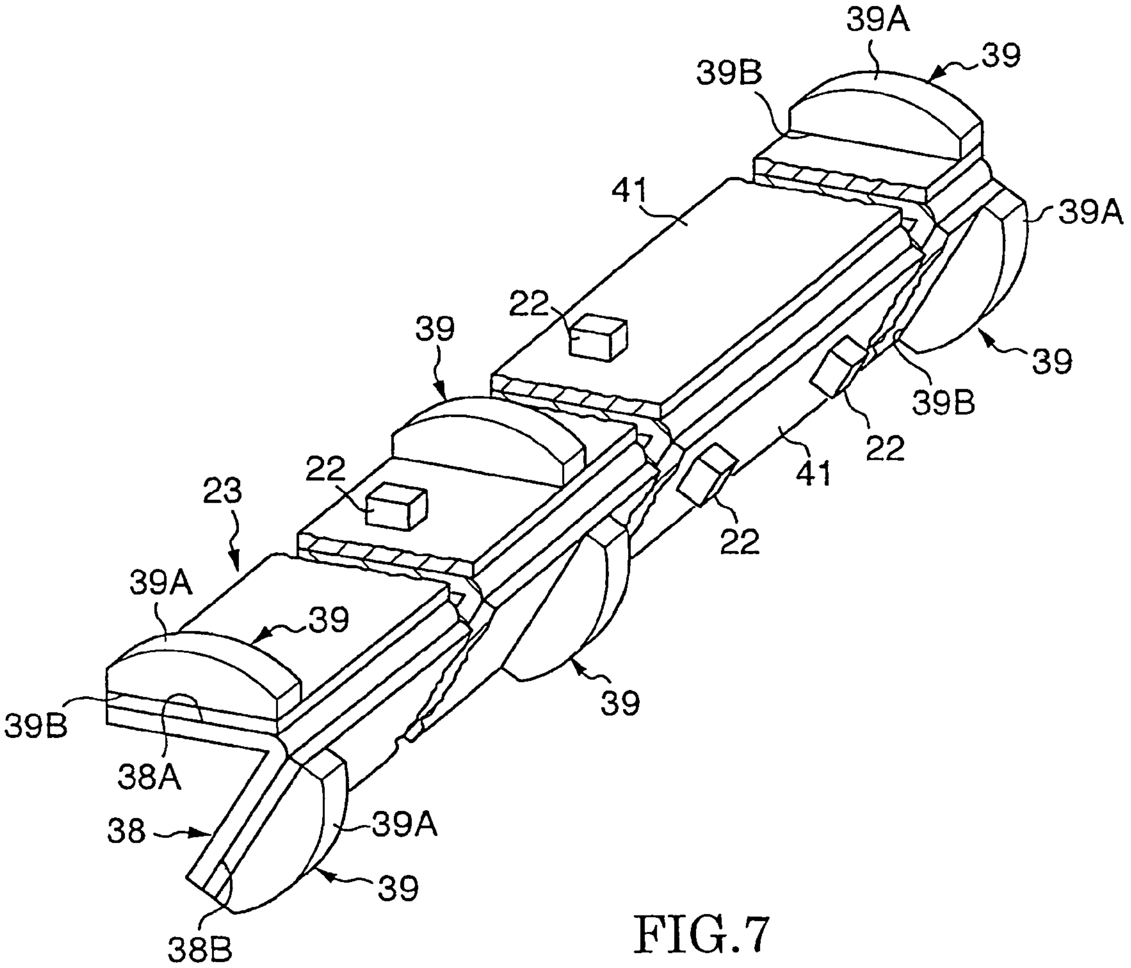
FIG. 7 is a schematic perspective view showing the detector units and retaining member.

As shown in FIG. 3, the above-mentioned retaining member 23 is accommodated in the interior of the tubular body 11 and retains the detector units 22 adjacent to the back sides of the respective keys 12. As also shown in FIGS. 6 and 7, the retaining member 23 includes an axially-extending member 38 extending along the axis of the tubular body 11, and a plurality of contact portions 39 provided on the axially-extending member 38 at predetermined intervals.

The axially-extending member 38 is in the form of a plate having a V sectional shape, and it has a length slightly smaller than a total or combined length of the main tube 15 and foot joint 16. The axially-extending member 38 has a first retaining surface 38A oriented toward the opening portion 18A of the tone hole 18 that is oriented in the upward direction of FIG. 3, and a second retaining surface 38B oriented toward the opening portion 18A of the tone hole 18 that is oriented in the obliquely-downward direction of FIG. 3. Each of the first and second retaining surfaces 38A and 38B has a separate printed circuit board 41 provided thereon, and each of the detector units 22 is connected to one of the printed circuit boards 41. Namely, each of the detector units 22 is retained on the first or second retaining surface 38A or 38B of the axially-extending member 38 via the printed circuit board 41.

Each of the contact portions 39 has a mounting surface 39B located adjacent to (or on the same side as) the front surface of the printed circuit board 41, and a curved surface 39A shaped to extend along the inner peripheral surface of the tubular body 11. Each of the contact portions 39 is formed of a resilient material, such as foamed rubber. Thus, as the retaining member 22 is inserted into the tubular body 11, the contact portions 39 are resiliently compressed to be pressed contact with the inner peripheral surface of the tubular body 11. Thus, the retaining member 23 can be prevented from moving within the tubular body 11 unless an intentional external source is applied to the retaining member 23, and the axially-extending member 38 and the tubular body 11 can be kept in non-contacting relation to each other. Also, the retaining member 23 can appropriately retain the individual detector units 22 at the predetermined positions, corresponding to the keys 12, such that the keys 12 and tubular body 11 and the individual detector units 22 are kept in non-contacting relation to each other.

Although not specifically shown, a pressure sensor is provided on or near the head joint 14 for detecting a blowing pressure to output an electrical signal corresponding to the detected pressure. The electrical signals output from the pressure sensor and detector units 22 are controlled via the predetermined control section and then supplied to a reproduction device (not shown), including an amplifier, speaker etc., for generation of reproduced tones of predetermined pitches.

In mounting or attaching the detector units 22 to the tubular body 11, the head joint 14 and the main tube 15 are first detached from each other, and then the retaining member 23, having the detector units 22 previously retained thereon, is inserted into the interior of the main tube 15 and foot joint 16. Thus, the retaining member 23 is snugly received in the main tube 15 and foot joint 16, and the individual contact portions 39 are resiliently pressed against the inner peripheral surface of the main tube 15 and foot joint 16. At that time, the first retaining surface 38A is oriented in the upward direction of FIG. 3, while the second retaining surface 38B is orientated in the obliquely-downward direction of FIG. 3. Thus, the detector units 22 can be automatically positioned adjacent to the reverse or back sides of the corresponding keys 12, and the individual detector units 22 and the axially-extending member 38 can be held in non-contacting relation to the keys 12 and tubular body 11.

Note that applying an intentional external source to the retaining member 23 under such conditions can rotate or displace the retaining member 23 within the tubular body 11 so that the position of each of the detector units 22 can be adjusted finely.

Further, in order to detach or dismount the detector units 22 from the tubular body 11, it is only necessary that the retaining member 23 be pulled out of the main tube 15 and foot joint 16 after the head joint 14 and the main tube 15 are detached from each other.

When a music performance is to be executed by generating electric reproduced tones using the wind instrument 10, the tone holes 18 are opened and closed by a human player manipulating the keys 12 with his or her finger tips, as is the case with a conventional flute. During that time, the detector units 22 detect relative distances to the back surfaces of the corresponding keys 12, so that electrical signals corresponding to the relative distances are supplied from the detector units 22 to the above-mentioned control section. The control section in turn detects opening/closing states of the keys 12 on the basis of the supplied electrical signals and then outputs the detected states to the reproduction device as predetermined tone pitch information, in response to which the reproduction device reproduces electric tones.

In the above-described manner, the instant embodiment not only can detect the opening/closing states of the keys 12 but also allows the detector units 22 to be attached and detached to and from the neighborhoods of the keys 12 with utmost ease and within a very short time, with the simplified construction. Thus, the single or same wind instrument 10 can selectively sound both electric reproduced tones based on the detection via the detector units 22 and acoustic tones based on air vibration by the instrument itself. Namely, the same wind instrument can be played both as an electronic musical instrument and as an acoustic musical instrument, with the result that the usability of the instrument can be dramatically enhanced.

Whereas the present invention has been shown and described in relation to the particular embodiment, the explanations having been made above are just for illustrative purposes and never intended to limit the present invention, and the shapes, positions, directions and other detailed constructions described above may be modified variously without departing from the basic technical idea and objects of the present invention.

Figure 8:
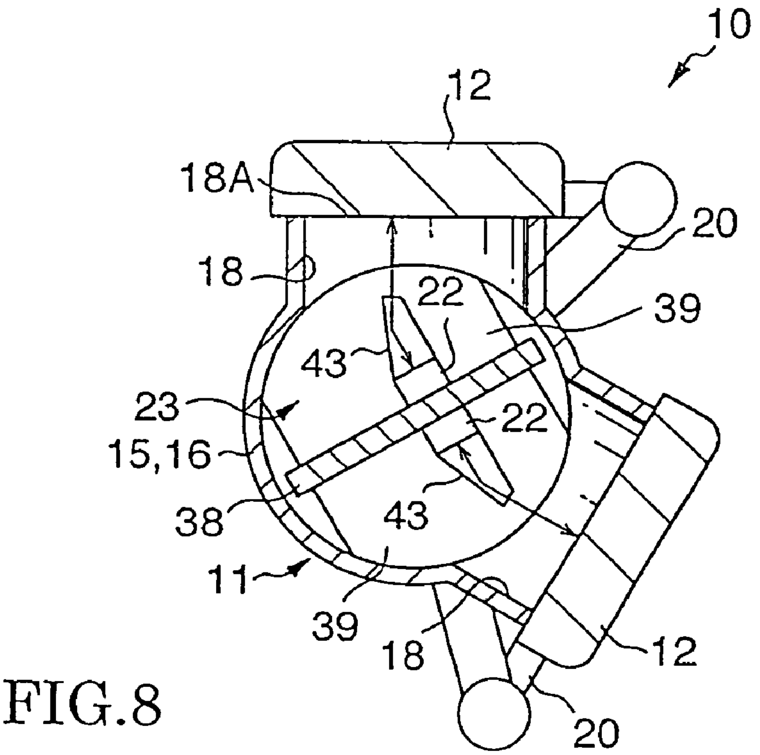
FIG. 8 is a sectional view, similar to FIG. 3, which shows a modification of the retaining member and detector units.
Figure 9:
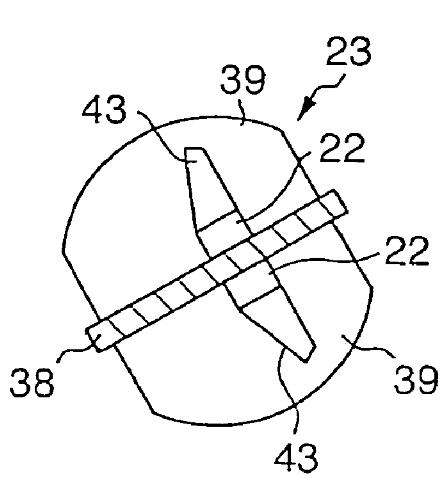
FIG. 9 is a sectional view, similar to FIG. 6, which shows the retaining member and detector units of FIG. 8.
Figure 10:
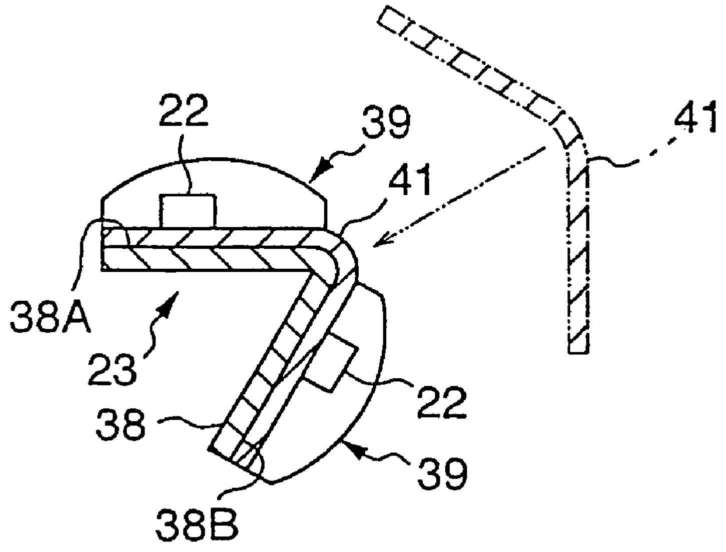
FIG. 10 is a sectional view, similar to FIG. 3, which shows another modification of the retaining member.

For example, the axially-extending member 38 may be modified variously, as exemplified in FIGS. 8 and 9. In these figures, the axially-extending member 38 is in the form of a plate with two opposite surfaces functioning as printed circuit boards with the detector units 22 retained on these two surfaces. Each of the detector units 22 includes a reflector member 43 in the form of a lens. The reflector member 43 not only reflects the infrared ray, emitted from the light emitting diode, toward the back surface of the corresponding key 12, but also again reflects the infrared ray, reflected off the back surface of the key 12, toward the photo transistor 26. The reflector member 43 may be replaced with a refractor member, such as a lens, for refracting the infrared ray.

As another modification of the axially-extending member 38, the printed circuit boards 41 provided on the first and second retaining surfaces 38A and 38B may be integrally formed into one piece; in this case, the integrally-formed printed circuit board 41 is mounted on the retaining surfaces 38A and 38B by being bent along the retaining surfaces 38A and 38B.

Figure 11:
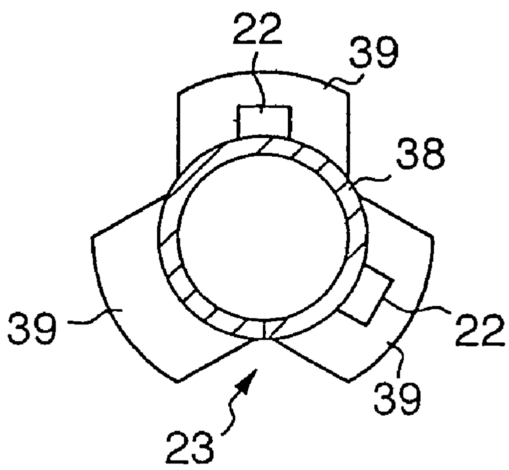
FIG. 11 is a sectional view, similar to FIG. 6, which shows still another modification of the retaining member.

Further, as illustratively shown in FIG. 11, the axially-extending member 38 may be formed by rolling up a printed circuit board into a cylindrical shape.

Furthermore, the axially-extending member 38 may be formed to have an even greater number of the retaining surfaces; such an increased number of the retaining surfaces allow the axially-extending member 38 to be more readily applied to a wind instrument 10 whose tone holes 18 are oriented in various different directions.

Furthermore, whereas the embodiment has been described in relation to the case where the wind instrument 10 is a flute, the wind instrument 10, to which the present invention is applied, may be of any other type, such as a soprano saxophone, bass flute, alto flute or piccolo, and the shape of the retaining member 23 and the positions of the detector units 22 may be modified in accordance with the shape of the tubular body 11 of the wind instrument 10 to which the present invention is applied.

What is claimed is:

1. A key detection structure for detecting opening/closing states or positions of operating keys of an electric wind instrument including a tubular body having a plurality of tone holes and the operating keys mounted on the tubular body to open/close the tone holes, the key detection structure comprising:

an axially-extending retaining member configured to be accommodated inside the tubular body;

a circuit board mounted to or integrally formed with the retaining member;

a plurality of detector units, mounted to the circuit board and positioned so that the detector units are positionable in corresponding relation to the tone holes so that each of the detector units becomes generally opposed to a back surface of the corresponding operating key to detect a relative distance to the back surface, each for out putting an electrical signal corresponding to the detected relative distance; and a plurality of resilient contact portions for suspending the retaining member inside the tubular body so that the detector units are suspended and kept in non-contacting relation with the operating keys and the tubular body, and wherein the resilient contact portions are spaced along the axially extending member and extend radially outwardly from the retaining member to press against an inner peripheral surface of the tubular body.

2. The key detection structure as claimed in claim 1, wherein the axially-extending member has at least two retaining surfaces oriented in different directions, and each of the retaining surfaces holds at least one of the detector units.

3. The key detection structure as claimed in claim 1, wherein each of the detector units comprises a photo reflector.

4. The key detection structure as claimed in claim 3, further comprising a reflector or refractor member provided between each of the detector units and the operating key corresponding to the respective detector unit so that light emitted by the photo reflector is reflected or refracted by the reflector member or the refractor member.

5. The key detection structure as claimed in claim 1, wherein the axially-extending member is tubular and the detector units are positioned so that at least one of the detector units is angularly offset from at least one of the detector units.

6. An electric wind instrument comprising:

a tubular body having a plurality of tone holes;

a plurality of operating keys mounted to the tubular body for opening/closing the tone holes; and a key detection structure for detecting opening/closing states or positions of the operating keys, wherein the key detection structure comprises:

an axially-extending retaining member positioned inside the tubular body;

a circuit board mounted to or integrally formed with the retaining member;

a plurality of detector units, mounted to the circuit board and positioned so that the detector units are positioned in corresponding relation to the tone holes so that each of the detector units is generally opposed to a back surface of the corresponding operating key to detect a relative distance to the back surface, each for outputting an electrical signal corresponding to the detected relative distance; and a plurality of resilient contact portions suspending the retaining member inside the tubular body so that the detector units are suspended and kept in non-contacting relation with the operating keys and the tubular body, wherein the resilient contact portions are spaced along the axially extending member and extend radially outwardly from the retaining member and press against an inner peripheral surface of the tubular body.

7. The electric wind instrument as claimed in claim 6, wherein the axially-extending body has at least two retaining surfaces oriented in different directions, and each of the retaining surfaces holding at least one of the detector units.

8. The electric wind instrument as claimed in claim 6, wherein the axially-extending body is tubular and the detector units are mounted in relation to the axially-extending tubular body so that at least one of the detector units is mounted angularly offset from at least one of the detector units.

9. The electric wind instrument as claimed in claim 6, wherein each of the detector units comprises a photo reflector.

10. The electric wind instrument as claimed in claim 9, further comprising a reflector or refractor member provided between each of the detector units and the operating key corresponding to the respective detector unit so that light emitted by the photo reflector is reflected or refracted by the reflector member or the refractor member.

* * * * *